(12) United States Patent
Atsumi

(10) Patent No.: US 10,014,059 B2
(45) Date of Patent: Jul. 3, 2018

(54) MEMORY CONTROLLER, MEMORY CONTROL METHOD, AND COEFFICIENT DECISION METHOD

(71) Applicant: TOSHIBA MEMORY CORPORATION, Minato-ku (JP)

(72) Inventor: Tsuyoshi Atsumi, Ota (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/686,833

(22) Filed: Aug. 25, 2017

(65) Prior Publication Data

US 2017/0352427 A1 Dec. 7, 2017

Related U.S. Application Data

(62) Division of application No. 14/755,900, filed on Jun. 30, 2015, now Pat. No. 9,773,563.

(60) Provisional application No. 62/139,424, filed on Mar. 27, 2015.

(51) Int. Cl.
| | |
|---|---|
| *G11C 11/34* | (2006.01) |
| *G11C 16/26* | (2006.01) |
| *G11C 29/02* | (2006.01) |
| *G11C 16/34* | (2006.01) |
| *G11C 29/04* | (2006.01) |

(52) U.S. Cl.
CPC ............ *G11C 16/26* (2013.01); *G11C 16/349* (2013.01); *G11C 29/021* (2013.01); *G11C 29/028* (2013.01); *G11C 2029/0409* (2013.01)

(58) Field of Classification Search
CPC ..... G11C 16/26; G11C 29/028; G11C 16/349; G11C 29/021; G11C 2029/0409

USPC ........................................ 365/185.02, 185.24
See application file for complete search history.

(56) References Cited

U.S. PATENT DOCUMENTS

| | | | |
|---|---|---|---|
| 7,808,831 B2 | 10/2010 | Mokhlesi et al. | |
| 7,925,936 B1* | 4/2011 | Sommer | G11C 11/5628 714/704 |
| 7,975,192 B2* | 7/2011 | Sommer | G06F 11/1068 714/719 |
| 7,990,767 B2 | 8/2011 | Sharon | |
| 8,145,984 B2* | 3/2012 | Sommer | G06F 11/1068 714/719 |
| 8,185,787 B1 | 5/2012 | Marrow | |
| 8,315,091 B2 | 11/2012 | Sharon | |
| 8,374,026 B2 | 2/2013 | Sharon | |
| 8,423,866 B2 | 4/2013 | Dusija | |
| 8,456,911 B2 | 6/2013 | Yuan | |

(Continued)

FOREIGN PATENT DOCUMENTS

| | | |
|---|---|---|
| JP | 2013-80450 A | 5/2013 |
| JP | 2013-122804 A | 6/2013 |

(Continued)

*Primary Examiner* — Viet Q Nguyen
(74) *Attorney, Agent, or Firm* — Oblon, McClelland, Maier & Neustadt, L.L.P.

(57) ABSTRACT

According to one embodiment, a distribution of threshold voltages of a plurality of memory cells is acquired from a nonvolatile memory which includes the plurality of memory cells, a malfunction state occurring in the nonvolatile memory is identified based on a shape of the distribution, and a read voltage when data is read out of the nonvolatile memory is set to a voltage value corresponding to a type of the malfunction state.

6 Claims, 9 Drawing Sheets

(56) References Cited

U.S. PATENT DOCUMENTS

| | | |
|---|---|---|
| 8,625,347 B2 | 1/2014 | Sakurada |
| 8,627,175 B2 | 1/2014 | Patapoutian |
| 8,811,076 B2 | 8/2014 | Venkitachalam |
| 8,874,992 B2 | 10/2014 | Desireddi |
| 8,879,317 B2 | 11/2014 | Litsyn |
| 8,914,696 B2 | 12/2014 | Chen |
| 9,190,163 B2 | 11/2015 | Park |
| 9,245,637 B2 | 1/2016 | Yang |
| 9,773,563 B2 * | 9/2017 | Atsumi .................. G11C 16/26 |
| 2005/0073884 A1 | 4/2005 | Gonzalez |
| 2010/0131809 A1 | 5/2010 | Katz |
| 2011/0182119 A1 | 7/2011 | Strasser |
| 2012/0005558 A1 | 1/2012 | Steiner |
| 2013/0148436 A1 | 6/2013 | Kurosawa |
| 2014/0026003 A1 | 1/2014 | Chen |
| 2014/0068365 A1 | 3/2014 | Chen |
| 2014/0229131 A1 | 8/2014 | Cohen et al. |
| 2015/0378801 A1 | 12/2015 | Navon |

FOREIGN PATENT DOCUMENTS

| | | |
|---|---|---|
| JP | 5444340 82 | 3/2014 |
| JP | 2014-154169 A | 8/2014 |
| WO | WO 2010/002752 A1 | 1/2010 |

* cited by examiner

MEMORY CONTROLLER, MEMORY CONTROL METHOD, AND COEFFICIENT DECISION METHOD

CROSS-REFERENCE TO RELATED APPLICATIONS

This application is a divisional application of U.S. application Ser. No. 14/755,900 filed Jun. 30, 2015, which is based upon and claims the benefit of priority from U.S. Provisional Application No. 62/139,424, filed on Mar. 27, 2015; the entire contents of each are incorporated herein by reference.

FIELD

Embodiments described herein relate generally to a memory controller, a memory control method, and a coefficient decision method.

BACKGROUND

In a nonvolatile memory representing a NAND flash memory, information is stored according to the amount of charges accumulated in a floating gate of a memory cell. The stored information can be read out by applying an appropriate voltage (a read voltage) to the memory cell.

However, a distribution of the amount of charges accumulated in the floating gate of the memory cell may be changed from an initial state as stress such as writing or erasing is built up. Therefore, the value of the read voltage may be changed.

DETAILED DESCRIPTION

In general, according to one embodiment, a memory controller includes a distribution acquisition unit, an identification unit, and a setting unit. The distribution acquisition unit acquires a distribution of threshold voltages of a plurality of memory cells from a nonvolatile memory which includes the memory cells. The identification unit identifies a malfunction state occurring in the nonvolatile memory based on a shape of the distribution. The setting unit sets a read voltage when data is read out of the nonvolatile memory to a voltage value corresponding to the type of the malfunction state.

Exemplary embodiments of a memory controller, a memory control method, and a coefficient decision method will be explained below in detail with reference to the accompanying drawings. The present invention is not limited to the following embodiments.

(First Embodiment)

Figure 1:
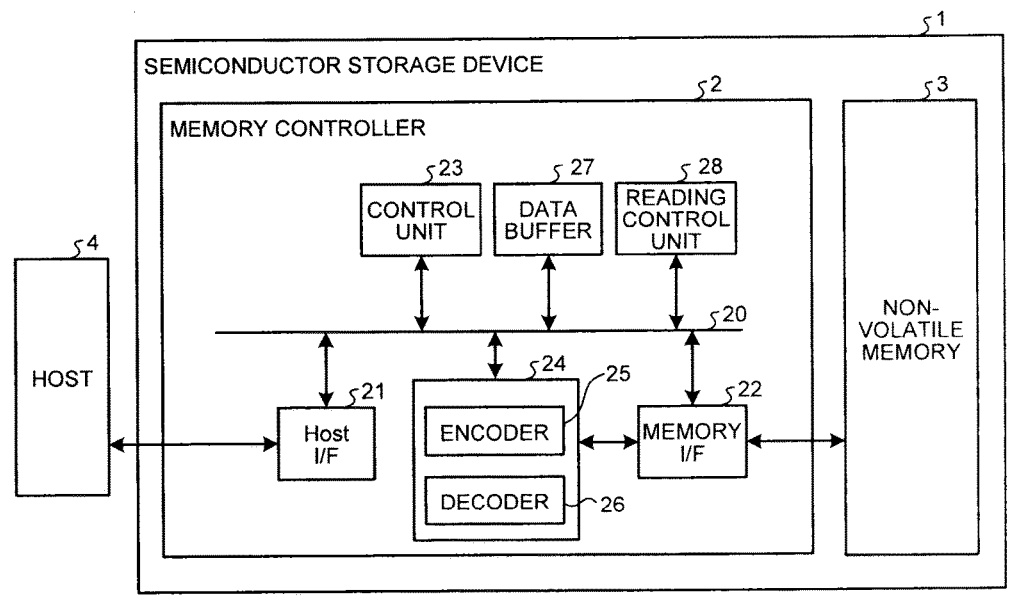
FIG. 1 is a block diagram illustrating an exemplary configuration of a storage device according to a first embodiment.

FIG. 1 is a block diagram illustrating an exemplary configuration of a storage device (a semiconductor storage device) according to a first embodiment. A semiconductor storage device 1 according to this embodiment includes a memory controller 2 and a nonvolatile memory 3. The semiconductor storage device 1 is configured to be connected to a host 4. The host 4, for example, is an information processing apparatus such as a personal computer or a portable terminal. FIG. 1 illustrates a state where the semiconductor storage device 1 and the host 4 are connected.

The nonvolatile memory 3 stores data therein in a nonvolatile manner. The nonvolatile memory 3, for example, is a nonvolatile memory such as a NAND flash memory. The nonvolatile memory 3 includes a plurality of memory cells (not illustrated) which are arranged in a matrix shape. In the nonvolatile memory 3, information is stored by the amount of charges accumulated in a floating gate of the memory cell. The stored information can be read out by applying a read voltage (described below) to the memory cell. Further, in this embodiment, the description will be described about an example in which the NAND flash memory is used as the nonvolatile memory 3, but the embodiments are not limited thereto.

The memory controller 2 controls writing to the nonvolatile memory 3 according to a write command from the host 4. In addition, the memory controller 2 controls reading from the nonvolatile memory 3 according to a read command from the host 4. The memory controller 2 includes a host I/F 21, a memory I/F 22, a control unit 23, an encoder/decoder 24, a data buffer 27, and a reading control unit 28. The respective parts included in the memory controller 2 are connected to each other through an internal bus 20.

The host I/F 21 outputs the command received from the host 4 and data (user data) of a writing target to the internal bus 20. In addition, the host I/F 21 transmits the data which is read out of the nonvolatile memory 3 and decoded by the encoder/decoder 24 (a decoder 26) toward the host 4.

The control unit 23 collectively controls the semiconductor storage device 1. The control unit 23 is a processor such as a central processing unit (CPU) or a micro processing unit (MPU). In a case where the command is received from the host 4 through the host I/F 21, the control unit 23 performs control according to the command. For example, in a case where a write request is received from the host 4, the control unit 23 instructs an encoder 25 to encode the user data (the writing target). In addition, the control unit 23 instructs the memory I/F 22 to perform the writing of the data encoded by the encoder 25 to the nonvolatile memory 3. In addition, in a case where a read request from the host 4 is received, the control unit 23 instructs the memory I/F 22 to perform the reading of the data from the nonvolatile memory 3. In addition, the control unit 23 instructs the decoder 26 to decode the data read out of the nonvolatile memory 3. The control unit 23 manages a writing address (a physical address on the nonvolatile memory 3) on the nonvolatile memory 3 of a code word.

The memory I/F 22 performs the writing or the reading of the data with respect to the nonvolatile memory 3 under the control of the control unit 23.

The encoder/decoder 24 includes the encoder 25 and the decoder 26. The encoder 25, for example, encodes the user data using an error correcting code such as a low density parity check (LDPC) or a Bose Chaudhuri Hocqenghem (BCH).

The decoder 26 decodes the encoded data read out of the nonvolatile memory 3 under the control of the memory controller 2. In addition, in the case of the decoding, the decoder 26 performs an error detection and an error correction (hereinafter, referred to as an error correcting process) of the read-out encoded data based on the error correcting code. In a case where it is determined that the decoder 26 fails in the error correcting process due to a factor such that the number of errors in the encoded data exceeds a performance of the error correcting process, the decoder 26 transmits a tracking command to the reading control unit 28.

The data buffer 27 temporarily stores the user data received from the host 4 therein until the data is stored in the nonvolatile memory 3, and temporarily stores the data read out of the nonvolatile memory 3 therein until the data is transmitted to the host 4. The data buffer 27, for example, is configured by a general-purpose memory such as a static random access memory (SRAM) or a dynamic random access memory (DRAM).

The reading control unit 28 controls a read voltage (described below) regarding the reading of the nonvolatile memory 3. Specifically, the reading control unit 28 performs a process (hereinafter, referred to as a read voltage correcting process) of correcting the read voltage according to the tracking command from the decoder 26. The details of the reading control unit 28 will be described below.

Further, among the configurations of the above-mentioned memory controller 2, the encoder/decoder 24 (the encoder 25 and the decoder 26) and the reading control unit 28 may be realized a processor provided in the control unit 23 and a predetermined program in cooperation with each other, or may be realized by an electronic circuit. In addition, FIG. 1 illustrates an exemplary configuration in which the encoder/decoder 24 and the memory I/F 22 are provided, but the embodiments are not limited thereto, and the encoder/decoder 24 may be built in the memory I/F 22. In addition, the reading control unit 28 may be built in any one of the memory I/F 22, the control unit 23, and the encoder/decoder 24.

In the case of the NAND flash memory, each memory cell is configured such that the current flows when a voltage equal to or more than a voltage value corresponding to the amount of charges of the floating gate is applied and does not flow when a voltage less than the subject voltage value is applied. The voltage as a boundary is called a threshold voltage. Each memory cell associates the data stored therein to a plurality of distributions (hereinafter, referred to as threshold distributions) of the threshold voltage. In the case of the data writing, electrons are injected such that the number of electrons (the amount of charges) of the floating gate corresponds to any one of the threshold distributions according to the data value. Herein, for the sake of simplicity, the description will be made about an example in which one memory cell stores one bit (that is, 1 bit/cell). In the case of 1 bit/cell, any one of two threshold distributions corresponds to "0", and the other one corresponds to "1". In addition, in the case of the data reading, it is possible to determine whether the data stored in the subject memory cell is "1" by applying the read voltage at the boundary between the threshold distributions.

Figure 2:
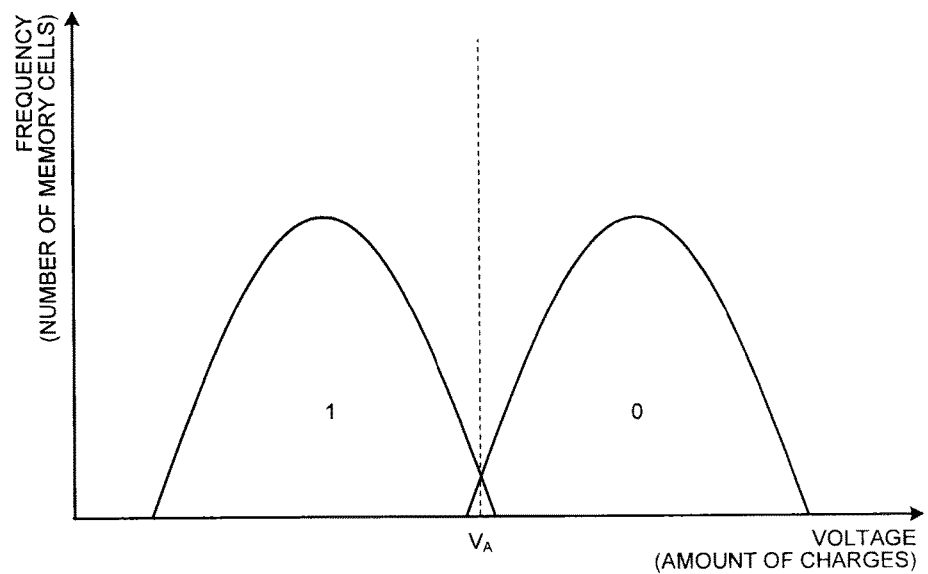
FIG. 2 is a diagram schematically illustrating an example of threshold distributions according to the first embodiment.

FIG. 2 is a diagram schematically illustrating an example of the threshold distribution. FIG. 2 illustrates the threshold distribution of an initial state (initial mode) in which the vertical axis represents a frequency (the number of memory cells) and the horizontal axis represents the threshold voltage (corresponding to the amount of charges of the floating gate). Further, the initial mode in this embodiment means a normal operation state before a transition to a defective mode (described below) such as immediately after the nonvolatile memory 3 begins to be used.

As illustrated in FIG. 2, the left threshold distribution in two threshold distributions corresponds to the data "1", and the right threshold distribution corresponds to the data "0". In the initial mode, it is possible to perform the reading in an optimal state in which the number of errors is minimized by setting the read voltage to a voltage value $V_A$ corresponding to a valley portion between two threshold distributions.

The voltage value $V_A$, for example, can be derived by the following method (hereinafter, referred to as Vth tracking). In this method, first, the threshold distribution illustrated in FIG. 2 is obtained by sequentially applying a voltage to the nonvolatile memory 3 (each memory cell) in a predetermined width. Then, the voltage value $V_A$ corresponding to the valley portion is derived as the read voltage based on the shape of the threshold distributions.

By the way, the NAND flash memory may fall into a malfunction state (hereinafter, referred to as a defective mode) such as a read disturbance, a data retention, or a program disturbance as stress such as writing or erasing is built up. In such a defective mode, the amount of charges of the floating gate is changed, so that the shapes of the threshold distributions are also changed. In addition, it is known that the shapes of the threshold distributions tend to be differently changed depending on the type of the defective mode.

Figure 3:
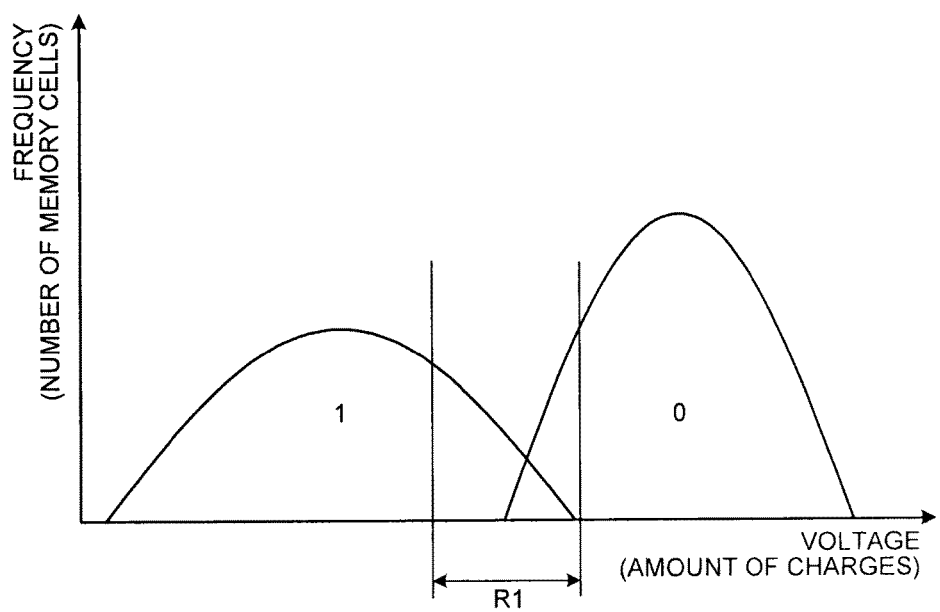
FIG. 3 is a diagram schematically illustrating an example of the threshold distribution in a defective mode according to the first embodiment.

FIG. 3 is a diagram illustrating an example of the threshold distributions in the defective mode. The shapes of the threshold distributions are changed from the shapes (see FIG. 2) in the initial mode in the case of the defective mode. For example, in the case of a certain defective mode, as illustrated in FIG. 3, a slope of the skirt portion of the left threshold distribution is formed with relative smoothness compared to the initial mode. In this way, in a case where the shapes of the threshold distributions are changed, when the data reading is performed using the read voltage of the initial mode, an error exceeding the performance of the error correcting process may occur. Therefore, in the related art, in a case where an error exceeding the performance of the error correcting process occurs, the read voltage is set again by performing the above-mentioned Vth tracking again.

However, in the Vth tracking, for example, as illustrated in FIG. 3, in a case where the slopes of the skirts in the right and left threshold distributions are different, when a voltage value corresponding to the valley portion between two threshold distributions is used as the read voltage, the read voltage which makes the number of errors minimized cannot be obtained.

Therefore, in the memory controller 2 (the reading control unit 28) of this embodiment, the type of the defective mode occurring in the nonvolatile memory 3 is determined from the shapes of the threshold distributions, and the read voltage derived in the Vth tracking is corrected to make the number of errors minimized based on a correction amount corresponding to the subject type. In the following, the details of the reading control unit 28 will be described.

Figure 4:
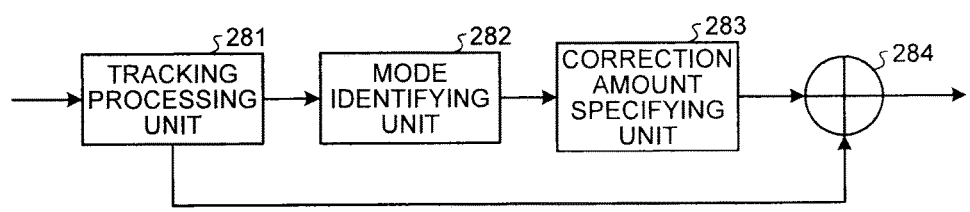
FIG. 4 is a diagram illustrating an example of a functional configuration of a reading control unit according to the first embodiment.

FIG. 4 is a diagram illustrating an example of a functional configuration of the reading control unit 28. As illustrated in FIG. 4, the reading control unit 28 includes a tracking processing unit 281, a mode identifying unit 282, a correction amount specifying unit 283, and an addition unit 284.

The tracking processing unit 281 acquires the threshold distribution of the nonvolatile memory 3 by performing the above-mentioned Vth tracking. In addition, the tracking processing unit 281 detects the valley portion from the acquired threshold distribution, and specifies a voltage value corresponding to the valley portion as the read voltage.

Figure 5:
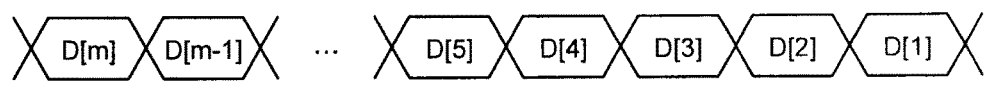
FIG. 5 is a diagram schematically illustrating a data series which is input to the reading control unit according to the first embodiment.

The mode identifying unit 282 receives the threshold distribution acquired by the tracking processing unit 281 as an input data series. FIG. 5 is a diagram schematically illustrating an example of the input data series which is input to the mode identifying unit 282. As illustrated in FIG. 5, the input data series is composed of m items of data (D[1], . . . , D[m], acquired at every voltage value having a predetermined width) arranged in an acquired order. Further, while a case is shown where, in each item of data, a set of the voltage value and the frequency of the threshold distribution is contained, a configuration in which only the frequency in this set is contained may be used. In this case, for example, it is desirable to associate data numbers 1 to m to the applied voltage value in order to specify the voltage value from the data number.

The mode identifying unit 282 identifies the defective mode of the nonvolatile memory 3 based on the input data series (the threshold distribution). In more detail, the mode identifying unit 282 performs a coefficient calculating process on the input data series so as to acquire a characteristic value showing the characteristic of the subject input data series. Then, the mode identifying unit 282 compares the characteristic value acquired from the input data series and the characteristic value of each defective mode to identify (determine) the defective mode of the nonvolatile memory 3. In the following, an inner configuration of the mode identifying unit 282 will be described.

Figure 6:
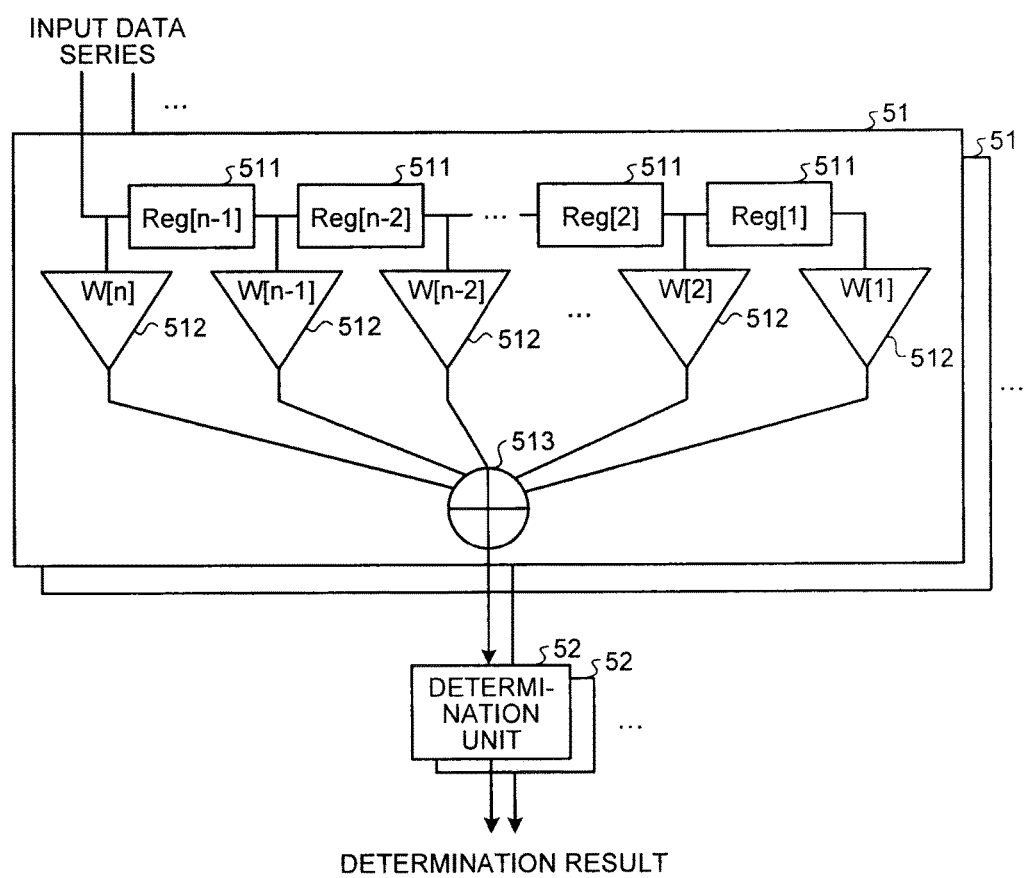
FIG. 6 is a diagram illustrating an example of an inner configuration of a mode determination unit according to the first embodiment.

FIG. 6 is a diagram illustrating an example of the inner configuration of the mode identifying unit 282. As illustrated in FIG. 6, the mode identifying unit 282 includes one or more (a plurality of stages) sets of a characteristic value acquisition unit 51 and a determination unit 52. The number of sets of the characteristic value acquisition unit 51 and the determination unit 52 is not particularly limited, and is desirably determined according to a number of the defective mode which is an identification target. In addition, each set of the characteristic value acquisition unit 51 and the determination unit 52 may be configured to identify one type of the defective mode, or may be configured to identify plural types of defective modes.

The characteristic value acquisition unit 51 includes (n−1) registers 511 (2≤n≤m) which serve as a delay unit, n multipliers 512, and an adder 513. The characteristic value acquisition unit 51 performs the coefficient calculating process on the input data series to acquire one characteristic value. Specifically, in the characteristic value acquisition unit 51, n items of data are extracted from the input data series using the register 511. In addition, the characteristic value acquisition unit 51 outputs the n items of extracted data to the multiplier 512 corresponding to the voltage value (data number) of each data.

Herein, an extraction target data is desirably in a section (voltage value) directly showing a characteristic of the shape of the threshold distribution of the defective mode (type) which is the identification target. As a section, for example, a voltage value of a section such as illustrated in a section R1 of FIG. 3 in which the valley portion of the threshold distribution is included is exemplified. Further, the voltage value or the data number of the extraction target data is assumed to be set in advance.

In the respective multipliers 512, coefficients (weights W[1] to W[n]) according to the data input to its own multiplier 512 are set in advance. The multiplier 512 multiplies the coefficient and the frequency contained in the input data, and outputs the multiplied result to the adder 513. Herein, the coefficient set in each of the multipliers 512 is designed to characterize the characteristic of the shape of the distribution of the defective mode which is the identification target. Further, a method of deciding the coefficient will be described below.

The adder 513 outputs one characteristic value by adding the respective values obtained by the multiplication of the respective multipliers 512. The characteristic values calculated herein are assumed to express the characteristic (a shape characteristic) of the input data series (the threshold distribution) in quantification.

The determination unit 52 compares the characteristic value output by the adder 513 and a condition which defines a range of the obtainable characteristic value in the defective mode of the identification target. Then, in a case where the characteristic value derived by the adder 513 corresponds to the condition of the defective mode, the determination unit 52 determines that the nonvolatile memory 3 is in the state of the subject defective mode.

Further, in a case where the characteristic value acquisition unit 51 is configured in multiple stages, the data (the data number) extracted from the input data series in each characteristic value acquisition unit 51 may be the same or not. In addition, the coefficient set in the multiplier 512 of each characteristic value acquisition unit 51 is a value according to the type of the defective mode which is the identification target of each of the characteristic value acquisition units 51.

Returning to FIG. 4, the correction amount specifying unit 283 specifies a correction amount corresponding to the type of the defective mode which is identified by the mode identifying unit 282. Specifically, the mode identifying unit 282 refers a data table in which each defective mode and the correction amount corresponding to the subject defective mode are associated, and specifies the correction amount corresponding to the type of the identified defective mode. Herein, in the correction amount, a value is determined based on tendency of the shape variation of the threshold distribution in each defective mode. Further, the data table is stored in a storage medium (not illustrated) which is included in the correction amount specifying unit 283 or the semiconductor storage device 1.

The addition unit 284 performs the correction of the read voltage by adding the correction amount specified by the correction amount specifying unit 283 to the read voltage specified by the tracking processing unit 281. In addition, the addition unit 284 sets the corrected read voltage to the memory I/F 22 as the read voltage of the nonvolatile memory 3. The read voltage set to the memory I/F 22 is stored as a setting value, and used in the case of the data reading performed later.

Figure 7:
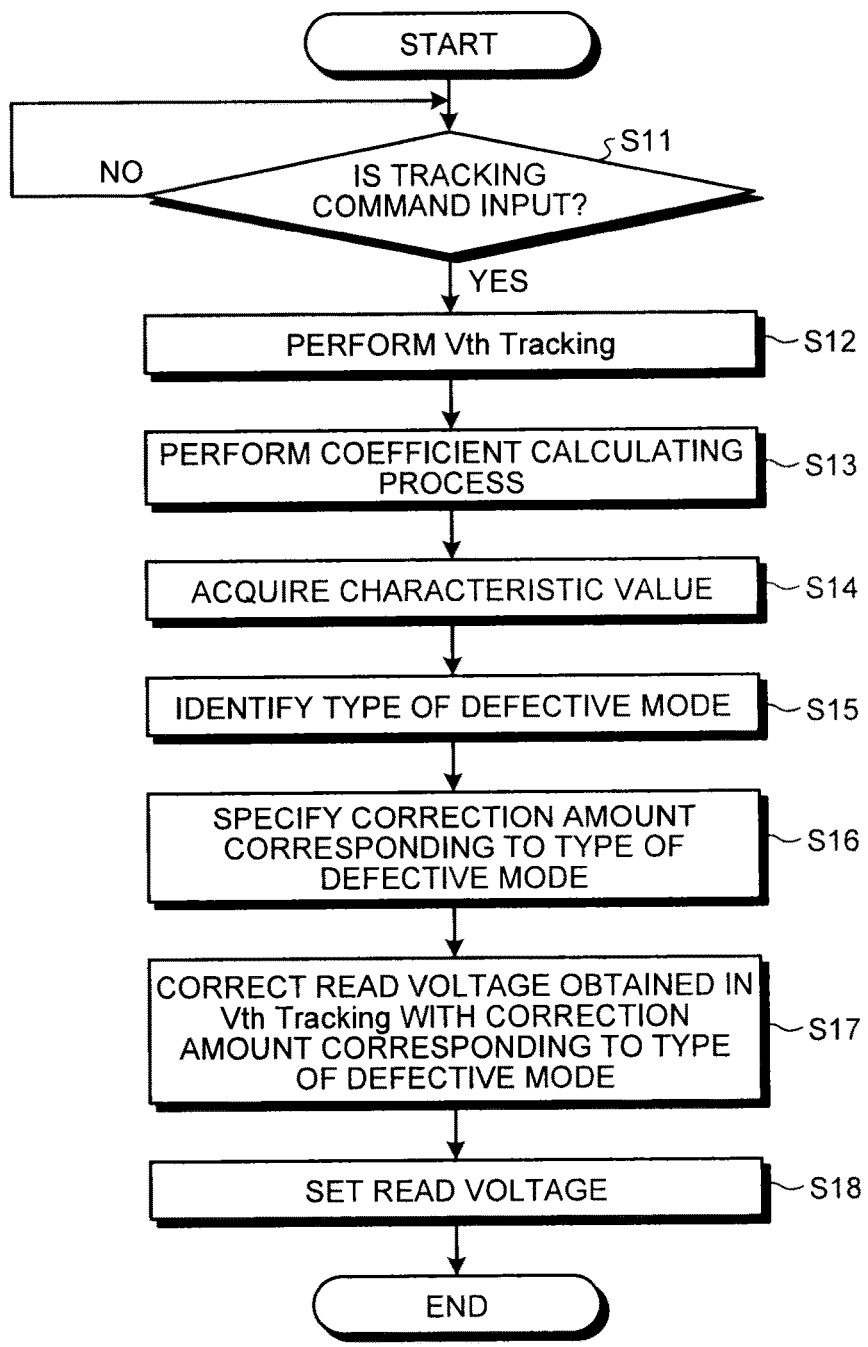
FIG. 7 is a flowchart illustrating an example of a procedure of a read voltage correcting process according to the first embodiment.

In the following, the read voltage correcting process performed by the reading control unit 28 will be described with reference to FIG. 7. FIG. 7 is a flowchart illustrating an example of a procedure of the read voltage correcting process.

First, the reading control unit 28 waits for the input of the tracking command from the decoder 26 (No in S11). When the tracking command is input, the tracking processing unit 281 performs the Vth tracking to acquire the threshold distribution, and specifies the read voltage from the valley portion of the threshold distribution (S12). The threshold distribution acquired in the Vth tracking is input to the mode identifying unit 282 as the input data series.

The mode identifying unit 282 extracts data from the input data series, and performs the coefficient calculating process on the subject data (S13) so as to acquire one characteristic value (S14). Next, the mode identifying unit 282 identifies the type of the defective mode occurring in the nonvolatile memory 3 based on the characteristic value acquired in S14 (S15).

Subsequently, the correction amount specifying unit 283 specifies the correction amount corresponding to the type of the defective mode specified in S15 (S16). Next, the addition unit 284 corrects the read voltage specified by the Vth tracking of S12 based on the correction amount specified in S16 (S17). Then, the reading control unit 28 sets the memory I/F 22 as a read voltage at the time of data reading to the read voltage corrected in S17 (S18), and this process is ended.

As described above, in a case where there occurs an error exceeding the performance of the error correcting process, the memory controller 2 identifies the type of the defective mode occurring in the subject nonvolatile memory 3 from the shape of the threshold distribution of the nonvolatile memory 3. Then, the memory controller 2 corrects the read voltage based on the correction amount corresponding to the identified defective mode. Therefore, even in a case where the nonvolatile memory 3 falls into the defective mode such as the read disturbance, the read voltage can be set to minimize the number of errors, so that it is possible to suppress the error occurring in the reading.

Further, in the embodiment, the description has been made about an example in which the correction is performed on the basis of the read voltage specified in the Vth tracking of S12, but the embodiments are not limited thereto. For example, the correction may be performed on the basis of the read voltage of the initial mode.

Next, a method of deciding a coefficient to be set in the multiplier 512 of the characteristic value acquisition unit 51 described above will be described. The decision of the coefficient is performed by an external apparatus (the information processing apparatus) of the memory controller 2. In this embodiment, the host 4 as the information processing apparatus is exemplified, but the embodiments are not limited thereto, and other information processing apparatuses may be employed.

Figure 8:
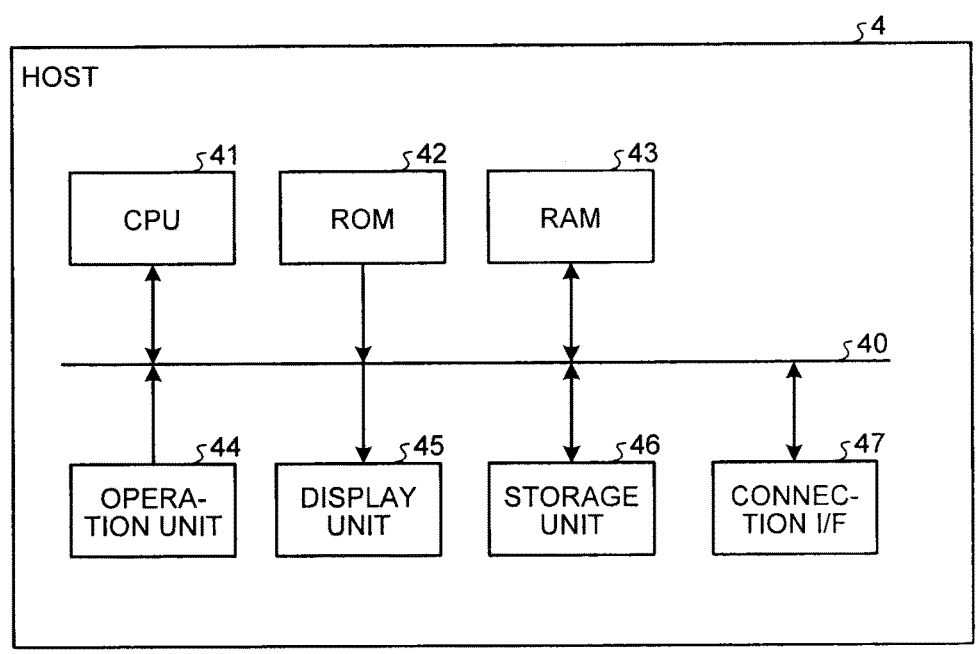
FIG. 8 is a diagram illustrating an example of a hardware configuration of a host according to the first embodiment.

FIG. 8 is a diagram illustrating an example of a hardware configuration of the host 4. As illustrated in FIG. 8, the host 4 includes a CPU 41, a read only memory (ROM) 42, a random access memory (RAM) 43, an operation unit 44, a display unit 45, a storage unit 46, and a connection I/F 47. The respective parts of the host 4 are connected through a bus 40.

The CPU 41 collectively controls the operations of the respective parts of the host 4. The CPU 41 performs various types of processes in cooperation with a program stored in the ROM 42 or the storage unit 46 in advance using a predetermined area of the RAM 43 as a work area.

The ROM 42 is a nonvolatile storage device in which a program and setting information regarding control of an information management support device are stored in a non-rewritable manner. The RAM 43 is a volatile storage device and serves as a work area of the CPU 41.

The operation unit 44 is provided with various types of input keys, receives information input from an operating user as an instruction signal, and outputs the instruction signal to the CPU 41. The display unit 45 is configured by a display device such as a liquid crystal display (LCD), and displays various types of information based on a display signal from the CPU 41. The storage unit 46 stores a program executed by the CPU 41 and various types of setting information therein in a rewritable manner.

The connection I/F 47 is an interface for the connection of a storage device such as the semiconductor storage device 1. The connection I/F 47 transmits various types of commands and the user data to the memory controller 2 under the control of the CPU 41. In addition, the connection I/F 47 receives the data transmitted from the memory controller 2. Further, the semiconductor storage device 1 connected to the connection I/F 47 may be used as the storage unit 46.

Figure 9:
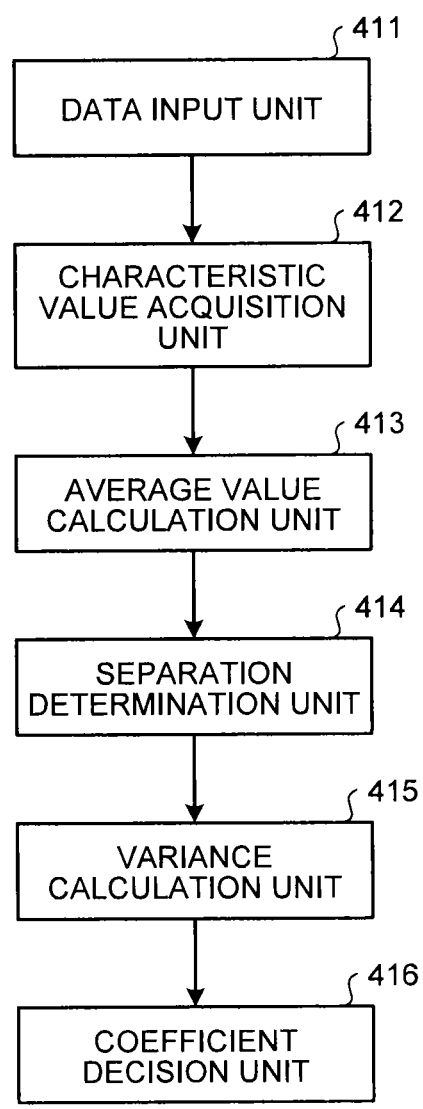
FIG. 9 is a diagram illustrating an example of a functional configuration related to a coefficient decision according to the first embodiment.

FIG. 9 is a diagram illustrating an example of a functional configuration related to a coefficient decision of the first embodiment. As illustrated in FIG. 9, the host 4 includes a data input unit 411, a characteristic value acquisition unit 412, an average calculation unit 413, a separation determination unit 414, a variance calculation unit 415, and a coefficient decision unit 416 as the functional configuration related to the coefficient decision. These functional units may be realized in cooperation of the CPU 41 (processor) with a program, or may be realized by an electronic device.

The data input unit 411 inputs the data series (see FIG. 5) of the threshold distribution of the defective mode. More specifically, the data input unit 411 inputs the data series (the threshold distribution) of a reference defective mode and the data series (the threshold distribution) of another defective mode which is a target to be compared with the subject defective mode. Herein, the reference defective mode corresponds to the defective mode of the identification target in the characteristic value acquisition unit 51 of the memory controller 2. In addition, the data input unit 411 inputs a plurality of data series for each defective mode.

Further, the data input unit 411 may input the data series (the threshold distribution) of the initial mode as the comparison target. In addition, the input source of the data series is not particularly specified. For example, the data series stored in the storage unit 46 may be configured as the input source, or the semiconductor storage device 1 connected in a connection I/F 47 may be configured as the input source.

The characteristic value acquisition unit 412 has the same configuration as the above-mentioned characteristic value acquisition unit 51 (see FIG. 6). In the following, the characteristic value acquisition unit 412 will be described based on the configuration of the characteristic value acquisition unit 51 illustrated in FIG. 6.

The characteristic value acquisition unit 412 extracts n items of data from each data series input from the data input unit 411, and derives (acquires) the characteristic value by performing the coefficient calculating process on the subject data. Herein, the target data to be extracted is desirably in a section (voltage value) directly showing a characteristic of the shape of the threshold distribution in the data series (the threshold distribution) of the reference defective mode.

The characteristic value acquisition unit 412 sequentially combines the coefficients (weights W[1] to W[n]) of the respective multipliers 512 in a predetermined valid range to output the characteristic value for each combination. The valid range of the coefficient is not particularly specified (for example, in a range of 0 to 1), and the coefficients of the respective multipliers 512 are sequentially changed at a predetermined pitch (for example, 0.01 or the like). Hereinafter, the combination of the coefficients set in the respective multipliers 512 will be simply referred to as a "parameter".

The average calculation unit 413 calculates an average value of the characteristic values output by the characteristic value acquisition unit 412 for each defective mode and for each parameter. A method of calculating the average value is not particularly specified. For example, the average calculation unit 413 may calculate the average value based on the following Equation (1) having a primary moment. Herein, x represents the characteristic value output by the characteristic value acquisition unit 412, and p(x) represents a probability density function for x.

$$\overline{x} = \int_{-\infty}^{\infty} xp(x)dx \qquad (1)$$

The separation determination unit 414 takes up a difference between the average value calculated with respect to the reference defective mode and the average value calculated with respect to the target defective mode for each identical parameter, and calculates the absolute value of the difference as a separation degree. Herein, a separation (identification) performance between the reference defective mode and the target defective mode becomes higher as the separation degree becomes higher.

The variance calculation unit 415 calculates a variance (a variance value) of the subject characteristic value for each parameter based on the characteristic value and the average value calculated with respect to the reference defective mode. Further, a method of calculating the variance value is not particularly specified. For example, when an event is at random, a variance value can be calculated based on a secondary moment equation shown in the following Equation (2).

$$\overline{(x-\overline{x})^2} = \int_{-\infty}^{\infty}(x-\overline{x})^2 p(x)dx = \overline{x^2} - (\overline{x})^2 \qquad (2)$$

The coefficient decision unit 416 decides a coefficient based on the separation degree and the variance value which are calculated for each parameter with respect to the reference defective mode. Specifically, the coefficient decision unit 416 selects N parameters having a higher separation degree among the used parameters as candidates. Herein, the number of candidate parameters is not particularly specified.

Then, the coefficient decision unit 416 determines a parameter having a minimum variance value as a formal coefficient for identifying the reference defective mode among the N candidate parameters. Further, it may also be configured that a parameter having a maximum separation degree is decided as the formal coefficient by setting the number (N) of parameters extracted as the candidates to 1.

Figure 10:
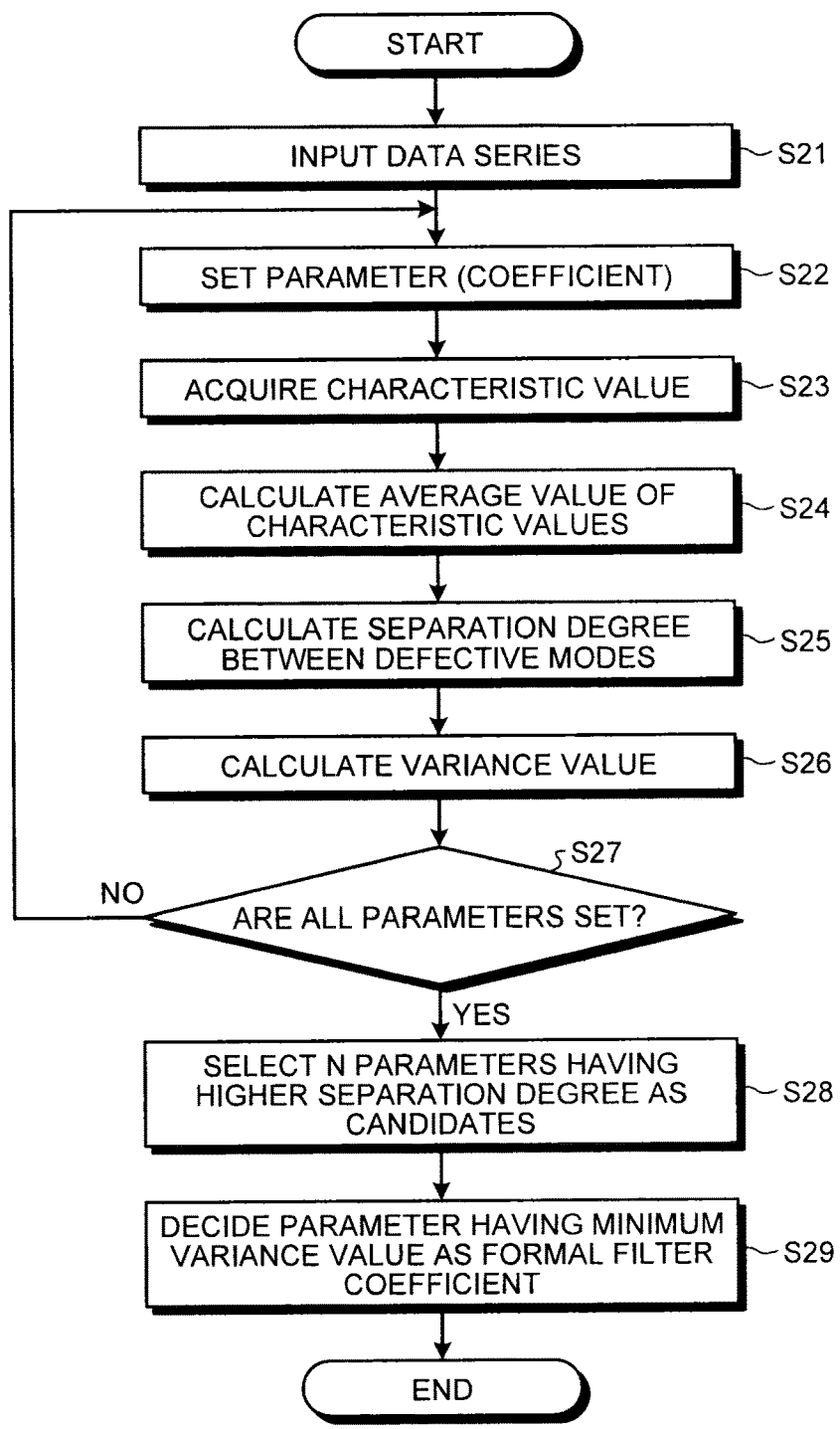
FIG. 10 is a diagram illustrating an example of a procedure of a coefficient decision process according to the first embodiment.

In the following, a coefficient decision process of performing the above-mentioned functional units will be described with reference to FIG. 10. FIG. 10 is a flowchart illustrating an example of a procedure of the coefficient decision process according to the first embodiment.

First, the data input unit 411 inputs a plurality of data series of the respective defective modes (and the initial mode) (S21). Next, when the parameters are set to the respective multipliers 512 (S22), the characteristic value acquisition unit 412 performs the coefficient calculating process based on the subject parameters, and acquires (derives) the characteristic values for the respective data series (S23).

The average calculation unit 413 calculates an average value of the characteristic values acquired in S23 for each defective mode (S24). Next, the separation determination unit 414 calculates the separation degree based on a difference between the average value calculated with respect to the reference defective mode and the average value calculated with respect to the target defective mode (S25). Next, the variance calculation unit 415 calculates the variance value based on the characteristic value acquired with respect to the reference defective mode and the average value of the subject characteristic value (S26).

Subsequently, the characteristic value acquisition unit 412 determines whether all the parameters are set in the valid range of the coefficient (S27). Herein, in a case where it is determined that all the parameters are not set (No in S27), the procedure returns to S22 and the characteristic value acquisition unit 412 is updated with the next parameter. In addition, in a case where it is determined that all the parameters are set (Yes in S27), the procedure proceeds to S28.

The coefficient decision unit 416 selects N parameters having a higher separation degree based on the separation degree calculated for each parameter with respect to the reference defective mode (S28). Then, the coefficient decision unit 416 decides a parameter having a minimum variance value as the formal coefficient among the N candidate parameters (S29).

The coefficient of the multiplier 512 decided in the above coefficient decision process, for example, is set in the multiplier 512 corresponding to the mode identifying unit 282 (the characteristic value acquisition unit 51) through the connection I/F 47. Therefore, in the mode identifying unit 282, since the characteristic value with which the type of the defective mode occurring in the nonvolatile memory 3 is identifiable can be obtained, the identification of the defective mode can be performed with accuracy.

(Second Embodiment)

In the first embodiment, the description has been made about an exemplary configuration in which the coefficient is decided directly using the data series of the threshold distribution acquired in each defective mode. In a second embodiment, the description will be made about an exemplary configuration in which the coefficient is decided using an approximate equation expressing the shape of the threshold distribution. Further, in this embodiment, similarly to the first embodiment, the coefficient is decided by the host 4, but the embodiments are not limited thereto and the coefficient may be decided by other apparatuses.

Figure 11:
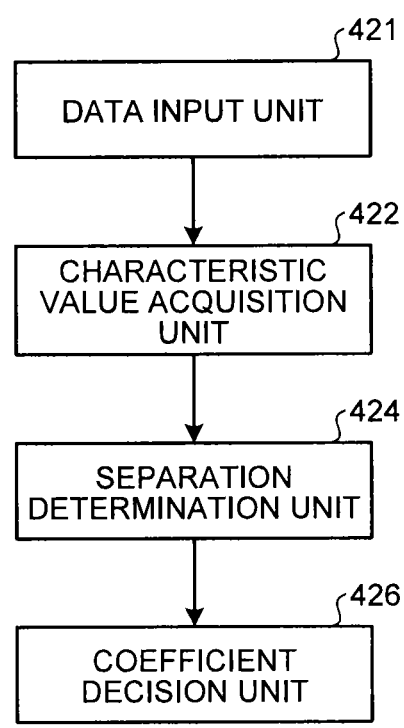
FIG. 11 is a diagram illustrating an example of a functional configuration related to a coefficient decision according to a second embodiment.

FIG. 11 is a diagram illustrating an example of a functional configuration related to the coefficient decision according to the second embodiment. As illustrated in FIG. 11, the host 4 includes a data input unit 421, a characteristic value acquisition unit 422, a separation determination unit 424, and a coefficient decision unit 426 as the functional configuration related to the coefficient decision. Further, these functional units may be realized in cooperation of the CPU 41 (processor) with a program, or may be realized by an electronic circuit.

The data input unit 421 inputs the approximate equation expressing the shape of the threshold distribution of the respective defective modes and the initial mode. The approximate equation, for example, may be expressed by n-th polynomials as the following Equations (3) to (6). Herein, Equation (3) expresses the shape of the threshold distribution under the read disturbance (RD). Equation (4) expresses the shape of the threshold distribution under the program disturbance (PD). Equation (5) expresses the shape of the threshold distribution under the data retention (DR). In addition, Equation (6) expresses the shape of the threshold distribution under the initial mode (RDini). Further, a0 to an, b0 to bn, c0 to cn, and d0 to dn are arbitrary coefficients.

$$(RD) Y(X) = a0 X^n + a1 X^{n-1} \ldots + an \quad (3)$$

$$(PD) Y(X) = b0 X^n + b1 X^{n-1} \ldots + bn \quad (4)$$

$$(DR) Y(X) = c0 X^n + c1 X^{n-1} \ldots + cn \quad (5)$$

$$(RDini) Y(X) = d0 X^n + d1 X^{n-1} \ldots + dn \quad (6)$$

In a case where the above approximate equations are used, by substituting each voltage value applied at the time of the acquisition of the threshold distribution for "X", and each of frequencies Y(X) corresponding to the subject voltage values can be obtained. Further, the above approximate equations may be derived in advance, or may be derived by the data input unit 421 from the threshold distribution of each defective mode. In addition, the formation of the equation is not particularly specified as long as the shape of the threshold distribution is expressed.

The characteristic value acquisition unit 422 has the same configuration as the above-mentioned characteristic value acquisition unit 51 (see FIG. 6). The characteristic value acquisition unit 422 calculates each characteristic value by performing the above coefficient calculating process on the frequency derived based on the approximate equation of each mode. Specifically, the characteristic value acquisition unit 422 substitutes a voltage value as an input target in each multiplier 512 for "X" of the approximate equation to calculate each frequency Y(X) corresponding to the subject voltage value. Herein, the characteristic value acquisition unit 422 derives n frequencies Y(X) based on a section (a voltage value) directly showing the characteristic of the shape of the threshold distribution in the data series (the threshold distribution) of the reference defective mode. Next, the characteristic value acquisition unit 422 multiplies the above-mentioned parameter (a set of coefficients) and each derived frequency Y(X) and integrates the result to output one characteristic value of each parameter.

the separation determination unit 424 takes up a difference between the characteristic value derived with respect to the reference defective mode and the characteristic value derived with respect to the target defective mode, and calculates the absolute value of the difference as the separation degree. Herein, a separation (identification) performance between the reference defective mode and the target defective mode becomes higher as the separation degree becomes higher.

The coefficient decision unit 426 decides the coefficient based on the separation degree derived for each parameter with respect to the reference defective mode. Specifically, the coefficient decision unit 416 decides a parameter having a maximum separation degree as a formal coefficient for identifying the reference defective mode among the used parameters.

Figure 12:
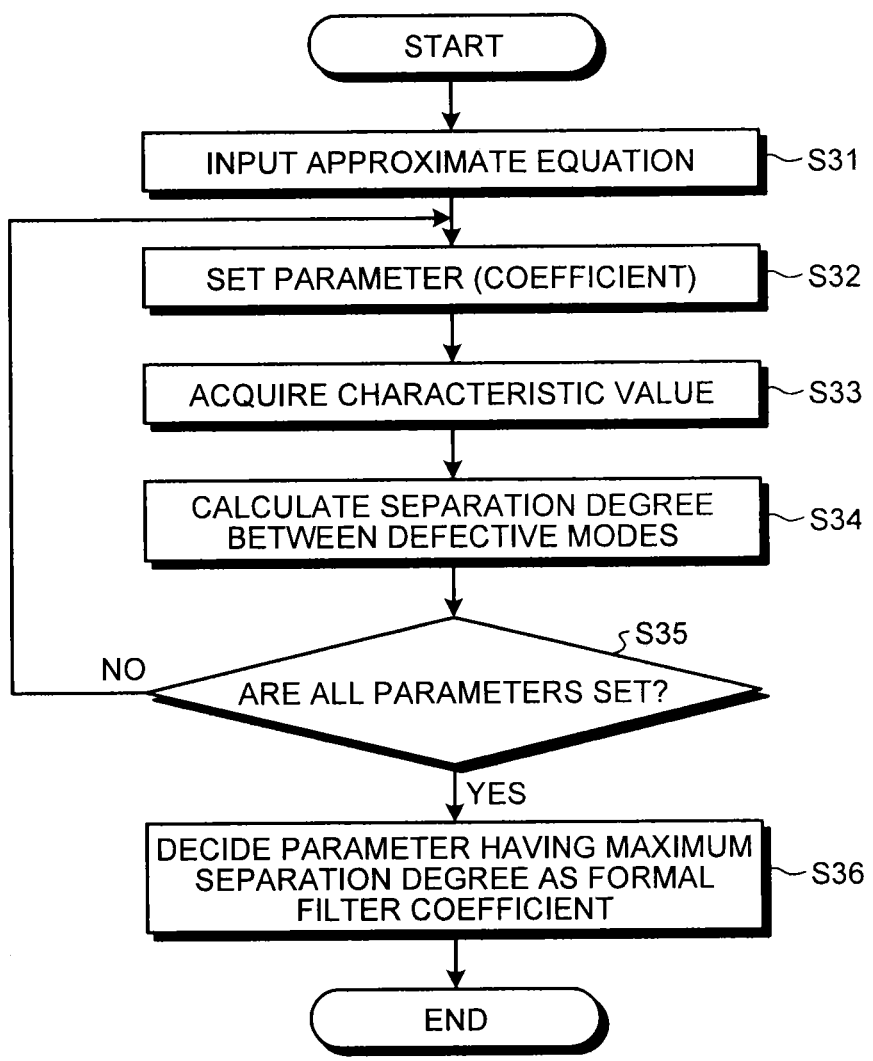
FIG. 12 is a diagram illustrating an example of a procedure of a coefficient decision process according to the second embodiment.

In the following, a coefficient decision process performed in each functional unit described above will be described with reference to FIG. 12. FIG. 12 is a flowchart illustrating an example of a procedure of the coefficient decision process according to the second embodiment.

First, the data input unit 421 inputs the approximate equation expressing the shape of the threshold distribution of the respective defective modes (and the initial mode) (S31). When the parameter is set to each the multiplier 512 (S32), the characteristic value acquisition unit 422 performs the coefficient calculating process based on the approximate equation of each defective mode to acquire (derive) one characteristic value for each defective mode (the approximate equation) (S33).

Next, the separation determination unit 424 calculates the separation degree based on a difference between the characteristic value derived with respect to the reference defective mode and the characteristic value derived with respect to the target defective mode (S34).

Subsequently, the characteristic value acquisition unit 422 determines whether all the parameters are set in the valid range of the coefficient (S35). Herein, in a case where it is determined that all the parameters are not set (No in S35), the procedure returns to S32 and the characteristic value acquisition unit 422 is updated with the next parameter. In addition, in a case where it is determined that all the parameters are set (Yes in S35), the procedure proceeds to S36.

In S36, the coefficient decision unit 426 decides a parameter having a maximum separation degree as the formal coefficient based on the separation degree calculated for each parameter with respect to the reference defective mode (S36).

The coefficient of the multiplier 512 decided in the above coefficient decision process, for example, is set in the multiplier 512 corresponding to the mode identifying unit 282 (the characteristic value acquisition unit 51) through the connection I/F 47. Therefore, in the mode identifying unit 282, since the characteristic value with which the type of the defective mode occurring in the nonvolatile memory 3 is identifiable can be obtained, the identification of the defective mode can be performed with accuracy.

In addition, according to this embodiment, since the characteristic value is calculated based on the approximate equation of the threshold distribution, it is possible to suppress the amount of calculation for the decision on the coefficient compared to the coefficient decision method in the first embodiment. Therefore, it is possible to perform the decision on the coefficient at a higher speed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the above embodiments, the read voltage is corrected according to the tracking command output in a case where the error correcting process is failed, but the timing of the correction is not limited thereto. For example, the read voltage may be corrected by performing the Vth tracking at an interval of a predetermined time period or at the time of the activation of the semiconductor storage device 1.

What is claimed is:

1. A coefficient decision method comprising:
receiving a first data series and a second data series, the first data series being acquired from a malfunctioning nonvolatile memory, the malfunctioning nonvolatile memory including a plurality of memory cells, the first data series indicating a distribution of threshold voltages of the memory cells, the second data series being acquired from a second nonvolatile memory, the second nonvolatile memory being in a state different from a state that the malfunctioning nonvolatile memory is in;
acquiring, for each of coefficients, a first characteristic value from the first date series, and acquiring, for each of the coefficients, a second characteristic value from the second data series, the first characteristic value of the first data series and the second characteristic value of the second data series being acquired using an identical coefficient;
calculating, for each of the coefficients, one separation degree on the basis of a difference between the first characteristic value and the second characteristic value, the separation degree indicating magnitude of the difference; and
determining, from among the coefficients, a coefficient having the highest separation degree as a coefficient for differentiating the state that the malfunctioning nonvolatile memory is in from the state that the second nonvolatile memory is in.

2. The method according to claim 1, further comprising:
receiving two or more of the first data series and two or more of the second data series;
calculating, for each of the coefficients, an average value of the characteristic values of the two or more first data series and an average value of the characteristic values of the two or more second data series; and
calculating, for each of the coefficients, the separation degree on the basis of a difference between the average value of the characteristic values of the two or more first data series and the average value of the characteristic values of the two or more second data series, the average value of the characteristic values of the two or more first data series and the average value of the characteristic values of the two more second data series being obtained using the same coefficient.

3. The method according to claim 2, farther comprising:
calculating, for each of the coefficients, a variance value of the characteristic values on the basis of the characteristic values of the two or more first data series and the average value of the characteristic values of the two or more first data series; and
determining, on the basis of the variance value, the coefficient for differentiating the state that the malfunctioning nonvolatile memory is in from the state that the second nonvolatile memory is in.

4. The method according to claim 1, wherein the first data series and the second data series are generated from an approximate equation indicating a shape of the distribution.

5. The method according to claim 1, further comprising:
extracting, from the first data series, data in a section indicating a characteristic of a distribution shape of the state that the malfunctioning nonvolatile memory is in, and
acquiring the first characteristic value of the first data series from the extracted data.

6. The method according to claim 1, wherein the state that the malfunctioning nonvolatile memory is in includes at least one of a read disturbance and a program disturbance.

* * * * *